(12) United States Patent
Blon

(10) Patent No.: US 10,951,217 B2
(45) Date of Patent: Mar. 16, 2021

(54) DEVICE AND METHOD FOR CONTROLLABLY DELAYING ELECTRICAL SIGNALS

(71) Applicant: Silicon Line GmbH, Munich (DE)

(72) Inventor: Thomas Blon, Munich (DE)

(73) Assignee: Silicon Line GmbH, Munich (DE)

( * ) Notice: Subject to any disclaimer, the term of this patent is extended or adjusted under 35 U.S.C. 154(b) by 0 days.

(21) Appl. No.: 16/247,289

(22) Filed: Jan. 14, 2019

(65) Prior Publication Data

US 2019/0245545 A1    Aug. 8, 2019

Related U.S. Application Data

(63) Continuation of application No. PCT/DE2017/100578, filed on Jul. 12, 2017.

(30) Foreign Application Priority Data

Jul. 14, 2016 (DE) ...................... 10 2016 113 031.1
Jun. 29, 2017 (DE) ...................... 10 2017 114 602.4

(51) Int. Cl.
*H03L 7/099* (2006.01)
*H03K 3/03* (2006.01)
(Continued)

(52) U.S. Cl.
CPC ............ *H03L 7/0998* (2013.01); *H03K 3/03* (2013.01); *H03K 3/0322* (2013.01); *H03K 5/13* (2013.01);
(Continued)

(58) Field of Classification Search
CPC .. H03K 5/13; H03K 3/03; H03K 5/26; H03K 3/0322; H03K 5/151; H03L 7/0998;
(Continued)

(56) References Cited

U.S. PATENT DOCUMENTS

2006/0071722 A1    4/2006    Paillet et al.
2006/0176118 A1    8/2006    Uchiyama et al.
2018/0097512 A1*   4/2018    Manian ................. H03L 7/0805

FOREIGN PATENT DOCUMENTS

WO    2007101824 A1    9/2007
WO    2013/174377 A2   11/2013
WO    2013/189494 A2   12/2013

OTHER PUBLICATIONS

International Search Report issued in PCT/DE2017/100578; dated Jan. 5, 2018.

* cited by examiner

*Primary Examiner* — Arnold M Kinkead
(74) *Attorney, Agent, or Firm* — Studebaker & Brackett PC

(57) ABSTRACT

A device and method for controllably delaying an electrical signal includes a first signal transfer path between a signal input and a signal output. The first signal transfer path includes a first signal transfer stage with a first differential pair and a common, adjustable first quiescent current source, and a second signal transfer path between the signal input and the signal output. The second signal transfer path includes a second signal transfer stage with a second differential pair and a common, adjustable second quiescent current source. An internal delay stage is arranged between the signal input and the second signal transfer stage and has a third differential pair and a common, adjustable third quiescent current source, and signal combination stage for additively superimposing the electrical signal transferred via the first signal transfer path on to the electrical signal transferred via the second signal transfer path.

20 Claims, 2 Drawing Sheets

(51) Int. Cl.
    *H03K 5/151*     (2006.01)
    *H03K 5/13*     (2014.01)
    *H03L 7/08*     (2006.01)
    *H03L 7/081*     (2006.01)
    *H03L 7/085*     (2006.01)
    *H03L 7/18*     (2006.01)
    *H04L 7/033*     (2006.01)

(52) U.S. Cl.
    CPC ............ *H03K 5/151* (2013.01); *H03L 7/0805* (2013.01); *H03L 7/085* (2013.01); *H03L 7/0812* (2013.01); *H03L 7/0995* (2013.01); *H03L 7/18* (2013.01); *H04L 7/033* (2013.01)

(58) Field of Classification Search
    CPC ... H03L 7/0995; H03L 7/0805; H03L 7/0812; H03L 7/085; H03L 7/18; H04L 7/033
    USPC ..... 327/552, 158, 296, 261, 355; 331/57, 45
    See application file for complete search history.

DEVICE AND METHOD FOR CONTROLLABLY DELAYING ELECTRICAL SIGNALS

CROSS-REFERENCE TO RELATED APPLICATIONS

This application is a continuation of international (WO) patent application no. PCT/DE2017/100578, filed 12 Jul. 2017, which claims the priority of German (DE) patent application no. 10 2016 113 031.1, filed 14 Jul. 2016, and of German (DE) patent application no. 10 2017 114 602.4, filed 29 Jun. 2017, the respective contents of each being hereby incorporated herein by reference.

FIELD OF THE INVENTION

The present invention basically relates to the technical field of clock and/or data recovery (CDR); in particular, the present invention relates to a device for controllably delaying an electrical signal as well as to an oscillator ring comprising at least one such device.

Furthermore, the present invention relates to a method for controlling the delay of an electrical signal as well as to this delay of the electrical signal by at least one such device and/or by at least one such oscillator ring.

Finally, the present invention relates to the use of at least one such device and/or of at least one such oscillator ring and/or of at least one such method.

BACKGROUND OF THE INVENTION

Regarding the technological background of the present invention, attention is drawn at first to the documents WO 2013/174377 A2 and WO 2013/189494 A2.

In the document WO 2013/174377 A2, a circuit arrangement and a method for calibrating at least one activation signal provided for a voltage-controlled oscillator for clock and data recovery are disclosed.

Reference is made in particular to circuits for clock and data recovery or CDR circuits with binary phase detectors wherein the phase detector can output two digital phase detector output signals "up" (for accelerating) and "down" (for delaying).

The circuit arrangement according to the document WO 2013/174377 A2 assumes a voltage-controlled ring oscillator with two tuning inputs wherein the frequency of the ring oscillator can be set separately via the two tuning inputs. The frequency change is adjusted by four separate varactor(-diode)s.

A disadvantage of this oscillator is its low output frequency because four varactors are required so that more parasitic capacitance is generated in the oscillator.

In order to increase the output frequency as much as possible, it is proposed according to the document WO 2013/174377 A2 to embody the circuit arrangement for calibrating the activation signal provided for a voltage-controlled oscillator for clock and data recovery with at least one calibration oscillator, at least one reference oscillator assigned to the calibration oscillator, at least one clock counter connected downstream of the calibration oscillator and of the reference oscillator and at least one digital-to-analog converter connected downstream of the clock counter wherein the clock counter is embodied for counting the respective clock number of the calibration oscillator and of the reference oscillator as well as for integrating a clock error resulting from the difference between these two clock numbers, and the digital-to-analog converter for converting the clock error into analogue tuning signals from which the calibrated activation signal is derivable.

The voltage-controlled oscillator is driven in such way that in the voltage-controlled oscillator not four but only two varactor(-diode)s are required, the frequency change no longer being achieved with two activation signals but only with one activation signal but both the reference oscillator and the calibration oscillator, however, also continuing to each contain four varactor(-diode)s.

From the document WO 2013/189494 A2, a circuit arrangement and a method for clock and/or data recovery are known wherein a voltage-controlled ring oscillator is used. Such a ring oscillator, implemented in the form of four voltage-controlled oscillator buffer stages, and implementations of such voltage-controlled oscillator buffer stages are shown.

Such a voltage-controlled oscillator buffer stage comprises four varactors whose capacitance values are adjustable via two tuning voltages up and dnb that can be fed to the anodic pairwise connections of the varactors and which determine the oscillation frequency of the ring oscillator.

With their capacitive load, the varactors serve as frequency (co-)determining elements of the frequency variation.

Since in particular two slightly different voltages are to be adjusted, the varactors are operated in two operating points:
    operating point with low capacity;
    operating point with high capacity.

If no frequency variation upwards or downwards is to take place, the varactors are operated at an operating point of medium capacity. This capacity, however, reduces the maximum achievable frequency of the oscillator.

In addition, the insertion of the varactors into the signal path of the oscillator alone leads due to the additional wiring to an increase in parasitic capacitive loads, which also reduce the maximum achievable frequency of the oscillator.

OBJECTS AND SUMMARY OF THE INVENTION

Starting from the above-explained disadvantages and shortcomings as well as taking the outlined prior art into account, the object of the present invention is to prevent or at least reduce parasitic capacitive loads.

This object is achieved by a device according to the present invention with the herein described features, by an oscillator ring according to the present invention with the herein described features, and by a method according to the present invention with the herein described features. Advantageous embodiments and expedient further developments of the present invention are characterized in the respective dependent claims.

This object is achieved by a device for controllably delaying an electrical signal, the device comprising
    a first signal transfer path between a signal input and a signal output, the first signal transfer path comprising
    a first signal transfer stage with a first differential pair and a common, adjustable first quiescent current source,
    a second signal transfer path between the signal input and the signal output, the second signal transfer path comprising
    a second signal transfer stage with a second differential pair and a common, adjustable second quiescent current source, and an internal delay stage, arranged between the signal input and the second signal transfer stage and having a third differential pair and a common, adjustable third quiescent current source, and a signal combination stage for additively superimposing the electrical signal transferred via the first signal transfer path on to the electrical signal transferred via the second signal transfer path, further comprising at least one current modulation stage for adjusting the quiescent current of at least one of the first and/or second and/or third quiescent current source.

This object is further achieved by an embodiment of the device according to the present invention, wherein
the first differential pair comprises at least two emitter- and/or source-coupled transistors, and/or
the second differential pair comprises at least two emitter- or source-coupled transistors, and/or
the third differential pair comprises at least two emitter- or source-coupled transistors.

This object is further achieved by an embodiment of the device according to the present invention, further comprising a first current modulation stage for adjusting the quiescent current of the first quiescent current source and a second current modulation stage for adjusting the quiescent current of the third quiescent current source.

This object is further achieved by an embodiment of the device according to the present invention, further comprising a first current modulation stage for adjusting the quiescent current of the first quiescent current source and a third current modulation stage for adjusting the quiescent current of the second quiescent current source.

This object is further achieved by an embodiment of the device according to the present invention, wherein the first and/or second and/or third current modulation stage is/are designed to supply and feed a respective additional current into the quiescent current setting of the first and/or second and/or third quiescent current source.

This object is further achieved by an embodiment of the device according to the present invention, wherein the first and/or second and/or third current modulation stage is respectively provided
with a first difference stage and an adjustable first current modulation quiescent current source common to the first difference stage, and
with a second difference stage and an adjustable second current modulation quiescent current source common to the second difference stage, wherein
the first difference stage is providable with, as a first control signal, a discretized signal for frequency increase and
the second difference stage is providable with, as a second control signal, a discretized signal for frequency reduction and
the first and the second current modulation quiescent current source of each current modulation stage are commonly adjustable.

This object is further achieved by an embodiment of the device according to the present invention, wherein
the first difference stage comprises a first current modulation difference pair, and/or
the second difference stage comprises a second current modulation difference pair.

This object is further achieved by an embodiment of the device according to the present invention, wherein
the first difference stage comprises at least two emitter- and/or source-coupled transistors, and/or
the second difference stage comprises at least two emitter- and/or source-coupled transistors.

This object is further achieved by an embodiment of the device according to the present invention, wherein
the first current modulation quiescent current source comprises at least one fourth and/or sixth quiescent current source and/or
the second current modulation quiescent current source comprises at least one fifth and/or seventh quiescent current source.

This object is further achieved by an embodiment of the device according to the present invention, wherein in the first and/or second and/or third current modulation stage, respectively, the first and the second current modulation quiescent current source are designed for supplying and feeding the respective additional current, controlled by the first and second control signal, into a quiescent current setting of the first and/or second and/or third quiescent current source, respectively.

This object is further achieved by an embodiment of the device according to the present invention, further comprising
a first supply voltage potential at a first supply voltage connection, and
a second supply voltage potential at a second supply voltage connection.

This object is further achieved by an embodiment of the device according to the present invention, wherein
the second supply voltage potential is ground potential and/or
the first supply voltage potential is positive compared to the second supply voltage potential.

This object is further achieved by an oscillator ring, comprising at least one device of the type described above.

This object is further achieved by a method for controlling the delay of an electrical signal and for said delaying the electrical signal by at least one device of the type described above and/or by at least one oscillator ring of the type described above,
wherein the first and/or second and/or third current modulation stage are/is respectively provided with,
as a first control signal, a discretized signal for frequency increase, and/or
as a second control signal, a discretized signal for frequency reduction,
wherein, controlled by the first and/or second control signal, in the first and/or second and/or third current modulation stage a respective additional current is generated, and
wherein the respective additional current of the first and/or second and/or third current modulation stage is fed into a quiescent current setting of the first and/or second and/or third quiescent current source for adjusting the quiescent current of at least one of the first and/or second and/or third quiescent current source.

This object is further achieved by a use of at least one device of the type described above and/or of at least one oscillator ring of the type described above and/or of at least one method of the type described above in the clock and/or data recovery by at least one digital phase detector wherein from the at least one digital phase detector a discretized signal for frequency increase is supplied as a first control signal and/or a discretized signal for frequency reduction is supplied as a second control signal.

In other words, the present invention provides a device for controllably delaying an electrical signal, the device comprising:

a first signal transfer path between a signal input and a signal output, the first signal transfer path comprising a first signal transfer stage with a first differential pair, in particular of emitter- or source-coupled transistors, and a common, adjustable first quiescent current source, a second signal transfer path between the signal input and the signal output, the second signal transfer path comprising a second signal transfer stage with a second differential pair, in particular of emitter- or source-coupled transistors, and a common, adjustable second quiescent current source, and an internal delay stage, arranged between the signal input and the second signal transfer stage and having a third differential pair, in particular of emitter- or source-coupled transistors, and a common, adjustable third quiescent current source; and a signal combination stage for additively superimposing the electrical signal transferred via the first signal transfer path on to the electrical signal transferred via the second signal transfer path, wherein at least one, in particular at least one first and/or second and/or third, current modulation stage for adjusting the quiescent current of at least one of the first and/or second and/or third quiescent current source is provided.

According to an advantageous embodiment of the present invention, the above object is further achieved by a device with a first current modulation stage for adjusting the quiescent current of the first quiescent current source and a second current modulation stage for adjusting the quiescent current of the third quiescent current source.

According to a further advantageous embodiment of the present invention, the above object is also achieved by a device with a first current modulation stage for adjusting the quiescent current of the first quiescent current source and a third current modulation stage for adjusting the quiescent current of the second quiescent current source.

In an advantageous embodiment of the present invention, the above object is further achieved by a device which is characterized in that the first and/or second and/or third current modulation stage are/is respectively provided with a first current modulation difference pair, in particular of emitter- or source-coupled transistors, and an adjustable first current modulation quiescent current source common to the first current modulation difference pair, and a second current modulation difference pair, in particular of emitter- or source-coupled transistors, and an adjustable second current modulation quiescent current source common to the second current modulation difference pair, wherein the first current modulation difference pair is providable with, as a first control signal, a discretized signal for frequency increase, and the second current modulation difference pair is providable with, as a second control signal, a discretized signal for frequency reduction, and the first and the second current modulation quiescent current source of each current modulation stage are commonly adjustable.

According to a further embodiment of the present invention, the above object is advantageously achieved by a device in which the first and/or second and/or third current modulation stage is/are designed to supply and feed a respective additional current into the quiescent current setting of the first and/or second and/or third quiescent current source.

According to another advantageous embodiment of the present invention, the above object is achieved by a device which is characterized in that in the first and/or second and/or third current modulation stage, respectively, the first and the second current modulation quiescent current source are designed for supplying and feeding the respective additional current, controlled by the first and second control signal, into a quiescent current setting of the first and/or second and/or third quiescent current source, respectively.

The above object is further achieved by an oscillator ring which comprises at least one device of the type described above.

Furthermore, the above object is achieved by a method for controlling the delay of an electrical signal and for said delaying the electrical signal by at least one device of the type described above and/or by at least one oscillator ring of the type described above wherein said method is characterized in that the first and/or second and/or third current modulation stage are/is respectively provided with, as a first control signal, a discretized signal for frequency increase, and/or as a second control signal, a discretized signal for frequency reduction, controlled by the first and/or second control signal, in the first and/or second and/or third current modulation stage a respective additional current is generated, and the respective additional current of the first and/or second and/or third current modulation stage is fed into a quiescent current setting of the first and/or second and/or third quiescent current source for adjusting the quiescent current of at least one of the first and/or second and/or third quiescent current source.

The above object is besides achieved by a use of at least one device of the type described above and/or of at least one oscillator ring of the type described above and/or of a method of the type described above in the clock and/or data recovery by at least one digital phase detector wherein from the at least one digital phase detector a discretized signal for frequency increase is supplied as a first control signal and/or a discretized signal for frequency reduction is supplied as a second control signal.

With regard to exemplary technical application areas of the present oscillator with frequency switching, it has to be taken into account, in particular for applications in clock recovery circuits (CDR=Clock and/or Data Recovery) with binary phase detector, that only small frequency variations with respect to a medium frequency are necessary so that here the desired frequency variation can be achieved advantageously only with the slight variation of the operating current of the oscillator differential stages, i.e. of the first and/or the second signal transfer stage, and/or of the internal delay stage.

Further exemplary technical application fields are:
oscillators for CDR (Clock and/or Data Recovery) with digital phase detector;
clock recovery in the receiver of a serial data stream if the data clock is embedded in the data stream, i.e. no local clock reference is available; or
oscillators for digital PLL (Phase Locked Loop, for frequency synthesis) with digital phase detector.

BRIEF EXPLANATION OF THE DRAWINGS

As already discussed hereinbefore, there are various possibilities for embodying and further developing the teaching of the present invention in an advantageous manner. To this end, on the one hand reference is made to the explanations above as well as to the dependent claims, on the other hand further embodiments, features and advantages of the present invention are explained in greater detail hereinafter, inter alia based upon the exemplary embodiments illustrated by FIG. 1 and FIG. 2.

It is shown in.

Like, similar or corresponding embodiments, elements or features are provided with identical reference numerals in FIG. 1 and in FIG. 2; a repeated description of these embodiments, elements or features is dispensed with.

DETAILED DESCRIPTION OF THE INVENTION

At this point it should be mentioned that a delay stage, embodied with only a first differential pair and a second differential pair as well as an internal delay stage and a common resistive load, corresponds to the state of the art, shown for example in the monograph by Behzad Razavi, "Design of Analog CMOS Integrated Circuits", pages 518 and 519, FIG. 14.48 and FIG. 14.49, generally known as interpolating delay stage:

According to FIG. 14.48(a) and FIG. 14.49(b), the first differential pair, the second differential pair and the internal delay stage each comprise a quiescent current source $I_{SS}$ controlled by a control voltage $V_{cont}$, the control voltage and hence the quiescent current of the quiescent current source of the first differential pair varying in opposite direction to the control voltage and hence the quiescent currents of the quiescent current sources of the second differential pair and of the internal delay stage.

Thus, the delay of the interpolating delay stage varies overall by variation of the control voltage between the extreme values determined by the delays of the first differential pair on the one hand—of the fast first signal transfer path—and of the interconnection of the second differential pair with the internal delay stage on the other hand—of the slow second signal transfer path—.

The frequency variation thus obtained between the minimum oscillation frequency of a ring oscillator embodied with such an interpolating delay stage when only the slow, second signal transfer path is switched on, and its maximum oscillation frequency when only the fast, first signal transfer path is switched on, however, goes far beyond the above-mentioned only small frequency variations in relation to a medium frequency.

Current modulation stages are added to that according to the invention for adjusting the quiescent currents of at least one of the quiescent current sources, i.e. for adjusting of the quiescent current of the quiescent current source of the first differential pair of the first signal transfer stage—referred to as first quiescent current source in the embodiment of the present invention,
and/or of the quiescent current of the quiescent current source of the second differential pair of the second signal transfer stage—referred to as second quiescent current source in the embodiment of the present invention, and/or of the quiescent current of the quiescent current source of the third differential pair of the internal delay stage— referred to as third quiescent current source in the embodiment of the present invention.

Figure 2:
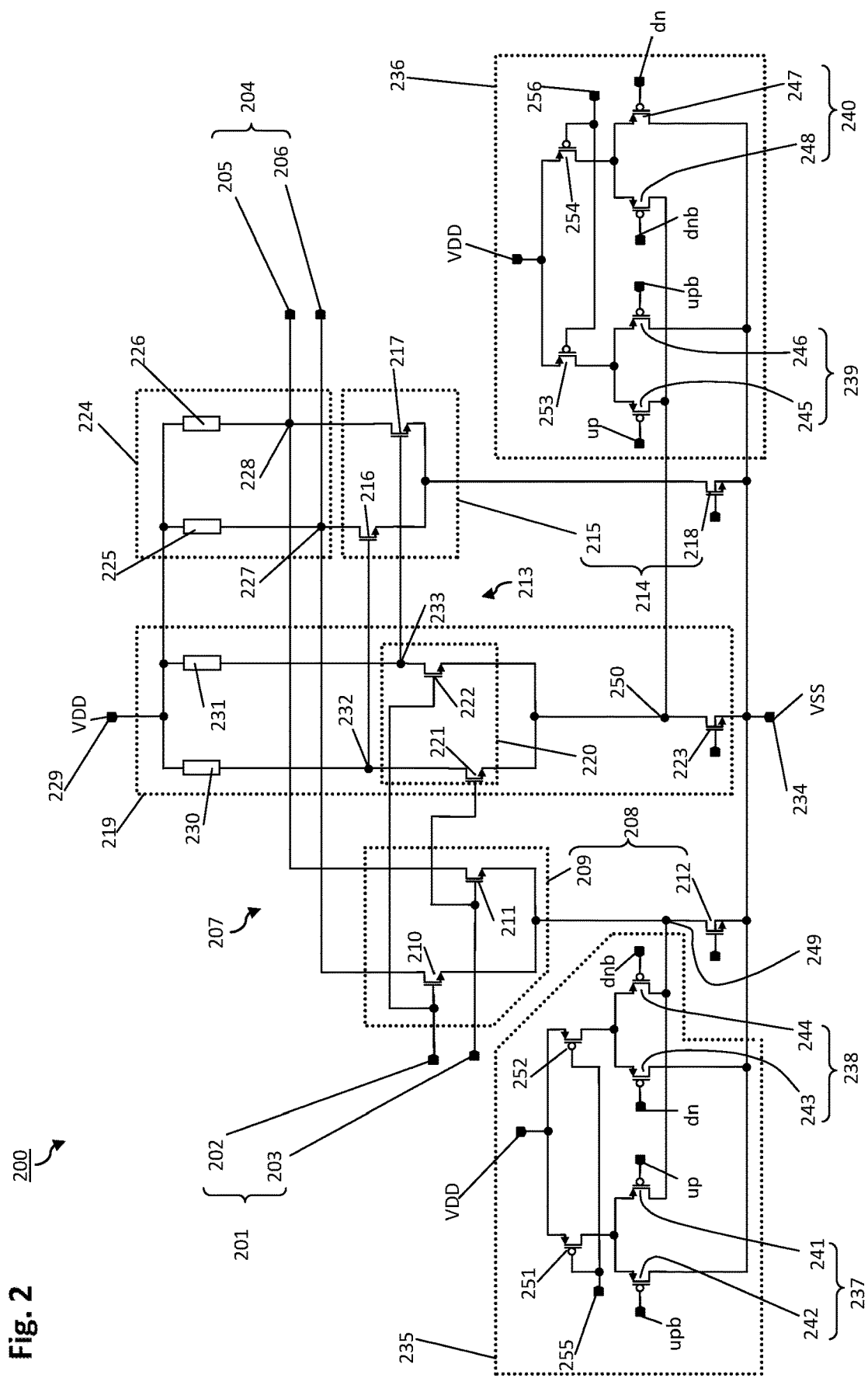
FIG. 2 a detailed schematic diagram of an exemplary embodiment of one of these delay stages according to the present invention.

Advantageously, these further differential stages are arranged as a first current modulation stage for setting the quiescent current of the first quiescent current source (=first current modulation) and as a second current modulation stage for setting the quiescent current of the third quiescent current source (=second current modulation) for modulation of the quiescent current of the first differential pair (=first current modulation) or of the internal delay stage (=second current modulation), as shown in FIG. 2.

In another embodiment of the present invention, not shown in the figures, these further differential stages are arranged advantageously as the first current modulation stage for setting the quiescent current of the first quiescent current source (=first current modulation) and as a third current modulation stage for setting the quiescent current of the second quiescent current source (=third current modulation) for modulation of the quiescent current of the first differential pair (=first current modulation) or of the second differential pair (=third current modulation).

Still another embodiment of the present invention, also not shown in the figures, comprises a first current modulation stage for setting the quiescent current of the first quiescent current source (=first current modulation), a second current modulation stage for setting the quiescent current of the third quiescent current source (=second current modulation) and a third current modulation stage for setting the quiescent current of the second quiescent current source (=third current modulation).

Figure 1:
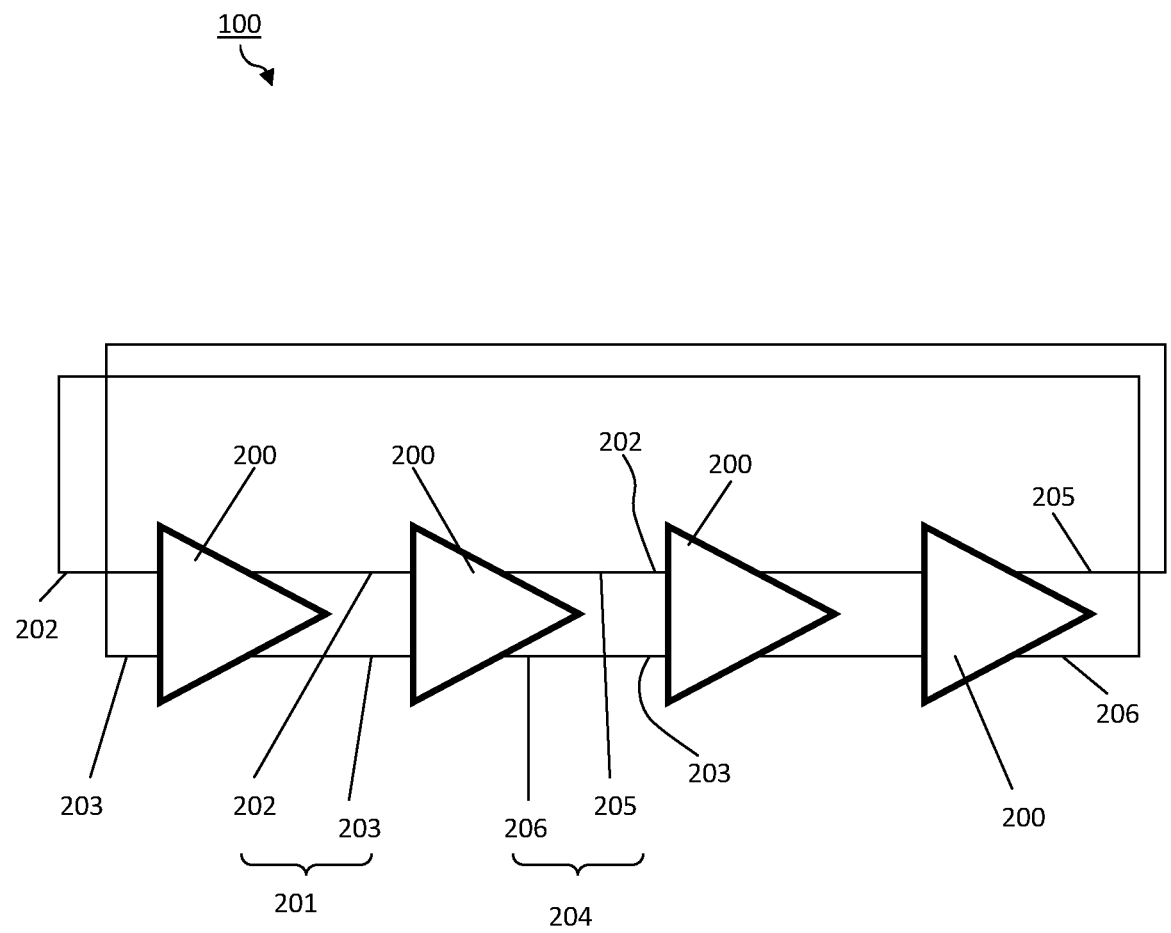
FIG. 1 a schematic diagram of an exemplary embodiment of an oscillator ring according to the present invention, said oscillator ring comprising several identical delay stages.

The devices according to the figures of the drawing are now described in more detail, with identical drawing elements comprising the same reference numerals and a repeated description of these drawing elements being omitted in order to avoid unnecessary repetitions. With regard to the configurations, features and advantages of the present invention, he following explanations thus refer—unless stated otherwise—to all embodiments of the present invention illustrated by FIG. 1 and FIG. 2:

FIG. 1 shows as embodiment an oscillator ring or ring oscillator 100 comprising several—here four—identical delay stages 200:

Such a delay stage 200 is hereinafter referred to as the device for controllable delay of an electrical signal according to the invention. The delay stage 200 is for example embodied as interpolating delay stage 200, as is shown by FIG. 2 hereinafter.

Each of the four delay stages 200 comprises a differential input 201 with two input terminals 202, 203 and a differential output 204 with two output terminals 205, 206.

An electrical signal supplied to differential input 201 is output at the differential output 204 with defined, adjustable delay. For this electrical signal, the delay stage 200 forms an electrical quadripole.

Four of these quadripoles, i.e. the four delay stages 200, are interconnected in FIG. 1 in a cascade connection, the differential output 204 of a first, i.e. preceding in the cascade connection, of the delay stages 200 being connected with the differential input 201 of a second, i.e. following in the cascade connection, of the delay stages 200.

At an end of the cascade connection, the differential output 204 of the last of the delay stages 200 is cross-connected with the differential input 201 of the first of the delay stages 200. This forms the oscillator ring on the one hand, and on the other hand the electrical signal from the differential output 204 of the last of the delay stages 200 is fed in reversed polarity to the differential input 201 of the first of the delay stages 200.

In this way, the electrical signal passes through the cascade connection in alternating polarity and thus oscillates at the differential inputs 201 and the differential outputs 204 at a frequency determined by the sum of the delays of all delay stages 200 of the cascade connection.

FIG. 2 shows in detail one of these delay stages 200 according to an embodiment of the present invention:

The delay stage 200 according to FIG. 2 is provided with a first signal transfer path 207 between the signal input of the delay stage 200 embodied as differential input 201 and the signal output of the delay stage 200 embodied as differential output 204.

The first signal transfer path 207 comprises a first signal transfer stage 208 with a first differential pair 209 of source-coupled transistors 210, 211 and a common, adjustable first quiescent current source 212. The delay stage 200 is further configured with a second signal transfer path 213 between the differential input 201 and the differential output 204.

The second signal transfer path 213 comprises a second signal transfer stage 214 with a second differential pair 215 of source-coupled transistors 216, 217 and a common adjustable second quiescent current source 218, and an internal delay stage 219 arranged between the differential input 201 and the second signal transfer stage 214 with a third differential pair 220 of source-coupled transistors 221, 222 and a common adjustable third quiescent current source 223.

All transistors of the first signal transfer path 207 and of the second signal transfer path 213, i.e. the first and the second source-coupled transistor 210, 211 of the first differential pair 209 as well as the common, adjustable first quiescent current source 212 common to the first differential pair 209, the first and the second source-coupled transistor 216, 217 of the second differential pair 215 as well as the adjustable second quiescent current source 218 common to the second differential pair 215 and the first and the second source-coupled transistors 221, 222 of the third differential pair 220 as well as the adjustable third quiescent current source 223 common to the third differential pair 220 are formed as NMOS field-effect transistors in the shown embodiment of the present invention.

The delay stage 200 is further provided with a signal combination stage 224 for additive superposition of the electrical signal transmitted via the first signal transfer path 207 with the electrical signal transmitted via the second signal transfer path 213.

Therefor, the signal combination stage 224 is provided with a resistive load common to the first differential pair 209 of the first signal transfer stage 208 and the second differential pair 215 of the second signal transfer stage 214 and comprising a first work resistor 225 and a second work resistor 226.

The first work resistor 225 of the signal combination stage 224 is connected on the one hand with a first connection point 227 of the drain terminals of the first source-coupled transistor 210 of the first differential pair 209 of the first signal transfer stage 208 and of the first source-coupled transistor 216 of the second differential pair 215 of the second signal transfer stage 214 and on the other hand with a first supply voltage terminal 229 carrying a first supply voltage potential VDD.

The second work resistor 226 of the signal combination stage 224 is connected on the one hand with a second connection point 228 of the drain terminals of the second source-coupled transistor 211 of the first differential pair 209 of the first signal transfer stage 208 and of the second source-coupled transistor 217 of the second differential pair 215 of the second signal transfer stage 214 and on the other hand with the first supply voltage terminal 229.

The first and second connection points 227, 228 each form a current node for the additive superposition of the currents in the drain terminals of the first source-coupled transistors 210, 216 and of the second source-coupled transistors 211, 217.

A voltage proportional to the additively superimposed currents in the drain terminals then respectively occurs at the work resistors; both voltages together form a differential signal at the differential output 204 of delay stage 200.

The internal delay stage 219 also comprises two work resistors, namely a third work resistor 230 which is connected, on the one hand, with a third connection point 232 of the drain terminal of the first source-coupled transistor 221 of the third differential pair 220 of the internal delay stage 219 and of the gate terminal of the first source-coupled transistor 216 of the second differential pair 215 of the second signal transfer stage 214 and, on the other hand, with the first supply voltage terminal 229, and a fourth work resistor 231 which is connected, on the one hand, with a fourth connection point 233 of the drain terminal of the second source-coupled transistor 222 of the third differential pair 220 of the internal delay stage 219 and of the gate terminal of the second source-coupled transistor 217 of the second differential pair 215 of the second signal transfer stage 214 and, on the other hand, with the first supply voltage terminal 229.

The first quiescent current source 212 is connected on the one hand with the interconnected source terminals of the first differential pair 209 of source-coupled transistors 210, 211 of the first signal transfer stage 208 and on the other hand with a second supply voltage terminal 234 carrying a second supply voltage potential VSS.

The second quiescent current source 218 is connected on the one hand with the interconnected source terminals of the second differential pair 215 of source-coupled transistors 216, 217 of the second signal transfer stage 214 and on the other hand with the second supply voltage terminal 234.

The third quiescent current source 218 is connected on the one hand with the interconnected source terminals of the third differential pair 220 of source-coupled transistors 221, 222 of the internal delay stage 219 and on the other hand with the second supply voltage terminal 234.

Advantageously, the quiescent current settings of the quiescent current sources 212, 218, 223 for the first, second and third differential pair 209, 215 and 220, respectively, can be carried out by control voltages to be supplied to the gate terminals of the NMOS field effect transistors forming the quiescent current sources 212, 218 and 223; in particular, ground potential is selected as second supply voltage potential VSS, and a positive voltage potential with respect to ground is selected as first supply voltage potential VDD.

According to the embodiment described, the device according to FIG. 2, i.e. the delay stage 200 is configured with a first current modulation stage 235 for setting the quiescent current of the first quiescent current source 212 and a second current modulation stage 236 for setting the quiescent current of the third quiescent current source 223.

In an unshown variation of this embodiment, a third current modulation stage may additionally be provided for setting the quiescent current of the second quiescent current source 218, the structure of this third current modulation stage being at least substantially identical to that of the first current modulation stage 235 and of the second current modulation stage 236.

Furthermore, variations are possible in which either only the first, second or third current modulation stage is provided, or only the first and the third current modulation stages, or only the second and the third current modulation stages. All these variations solve the problem of the present invention. As an example, only the embodiment according to FIG. 2 is described here.

In the embodiment according to FIG. 2, the first current modulation stage 235 and the second current modulation stage 236 are identically constructed. Each of the two current modulation stages 235, 236 comprises a first differential stage 237 and 239 respectively and a second differential stage 238 and 240 respectively per two source-coupled transistors 241 and 242 or 245 and 246 or 243 and 244 or 247 and 248 respectively.

The drain terminals of the second source-coupled transistor 242 of the first differential stage 237 of the first current modulation stage 235 and of the first source-coupled transistor 243 of the second differential stage 238 of the first current modulation stage 235, as well as of the second source-coupled transistor 246 of the first differential stage 239 of the second current modulation stage 236 and of the first source-coupled transistor 247 of the second differential stage 240 of the second current modulation stage 236 are connected with the second supply voltage terminal 234 carrying the second supply voltage potential VSS.

The drain terminals of the first source-coupled transistor 241 of the first differential stage 237 of the first current modulation stage 235 and of the second source-coupled transistor 244 of the second differential stage 238 of the first current modulation stage 235 are connected with each other and with a fifth connection point 249 of the coupled source terminals of the first source-coupled transistor 210, and of the second source-coupled transistor 211 of the first differential pair 209 of the first signal transfer stage 208 with the first quiescent current source 212 to the first differential pair 209 of the first signal transfer stage 208.

The drain terminals of the first source-coupled transistor 245 of the first differential stage 239 of the second current modulation stage 236 and of the second source-coupled transistor 248 of the second differential stage 240 of the second current modulation stage 236 are connected with each other and with a sixth connection point 250 of the coupled source terminals of the first source-coupled transistor 221 and the second source-coupled transistor 222 of the third differential pair 220 of the internal delay stage 219 with the third quiescent current source 223 to the third differential pair 220 of the internal delay stage 219.

In the first current modulation stage 235, the source terminals of the first source-coupled transistor 241 and of the second source-coupled transistor 242 of the first differential stage 237 are connected with each other and with the drain terminal of a transistor forming a fourth quiescent current source 251 comprised by the first current modulation stage 235, and further the source terminals of the first source-coupled transistor 243 and of the second source-coupled transistor 244 of the second differential stage 238 are connected with each other and with the drain terminal of a transistor forming a fifth quiescent current source 252 comprised by the first current modulation stage 235.

The source terminals of the transistors forming the fourth and the fifth quiescent current sources 251, 252 are connected with the first supply voltage terminal 229 carrying the first supply voltage potential VDD.

The gate terminals of the transistors forming the fourth and the fifth quiescent current sources 251, 252 are connected with a common control voltage terminal 255, via which a common control voltage is supplied in operation to the fourth and the fifth quiescent current sources 251, 252 for setting an, in particular matching, quiescent current in the fourth and the fifth quiescent current sources 251, 252. The fourth and the fifth quiescent current sources 251, 252 thus comprise a common quiescent current setting by the common control voltage at the gate terminals.

In the same way, in the second current modulation stage 236, the source terminals of the first source-coupled transistor 245 and of the second source-coupled transistor 246 of the first differential stage 239 are connected with each other and with the drain terminal of a transistor forming a sixth quiescent current source 253 comprised by the second current modulation stage 236, and further the source terminals of the first source-coupled transistor 247 and of the second source-coupled transistor 248 of the second differential stage 240 are connected with each other and with the drain terminal of a transistor forming a seventh quiescent current source 254 comprised by the second current modulation stage 236.

The source terminals of the transistors forming the sixth and the seventh quiescent current sources 253, 254 are also connected with the first supply voltage terminal 229 carrying the first supply voltage potential VDD.

Accordingly, the gate terminals of the transistors forming the sixth and the seventh quiescent current sources 253, 254 are connected with a common control voltage terminal 256 via which a common control voltage is supplied in operation to the sixth and the seventh quiescent current sources 253, 254 for setting an, in particular matching, quiescent current in the sixth and the seventh quiescent current sources 253, 254. The sixth and the seventh quiescent current sources 253, 254 thus comprise a common quiescent current setting by the common control voltage at the gate terminals.

All transistors in the first and the second current modulation stages 235 and 236 are embodied as PMOS field effect transistors in the embodiment according to FIG. 2.

The two differential stages 237, 238 or 239, 240 of each of the current modulation stages 235 or 236 are controlled by control signals at the gate terminals of the source-coupled transistors 241, 242 or 243, 244 or 245, 246 or 247, 248 of the differential stages 237 or 238 or 239 or 240.

These control signals at the gate terminals of the source-coupled transistors 241, 242 or 243, 244 or 245, 246 or 247, 248 are preferably discretized control signals which can preferably be supplied by a digital phase detector.

The control signals from the phase detector usually consist of a discretized signal for frequency increase (in FIG. 2 embodied as differential signal up/upb, with upb=complementary signal to up) and a discretized signal for frequency reduction (in FIG. 2 embodied as differential signal dn/dnb, with dnb=complementary signal to dn).

In particular, in the embodiment according to FIG. 2, it is supplied to the gate terminal of the first source-coupled transistor 241 of the first differential stage 237 of the first current modulation stage 235 the differential signal up for frequency increase, second source-coupled transistor 242 of the first differential stage 237 of the first current modulation stage 235 the complementary differential signal upb for frequency increase, first source-coupled transistor 243 of the second differential stage 238 of the first current modulation stage 235 the differential signal dn for frequency reduction, second source-coupled transistor 244 of the second differential stage 238 of the first current modulation stage 235 the complementary differential signal dnb for frequency reduction, first source-coupled transistor 245 of the first differential stage 239 of the second current modulation stage 236 the differential signal up for frequency increase, second source-coupled transistor 246 of the first differential stage 239 of the second current modulation stage 236 the complementary differential signal upb for frequency increase, first source-coupled transistor 247 of the second differential stage 240 of the second current modulation stage 236 the differential signal dn for frequency reduction, and second source-coupled transistor 248 of the second differential stage 240 of the second current modulation stage 236 the complementary differential signal dnb for frequency reduction.

The common control voltage or common control voltages at the common control voltage terminals 255 and/or 256, respectively, is/are selectable independently of the control voltages to be supplied to the gate terminals of the NMOS field effect transistors forming the quiescent current sources 212, 218 and 223 for the quiescent current settings of the quiescent current sources 212, 218, 223 for the first, second and third differential pair 209, 215 and 220, respectively.

This and mutually independent dimensioning of the transistors of the first to third quiescent current sources 212, 218, 223 and of the transistors of the fourth to seventh quiescent current sources 251, 252, 253, 254 make it possible to set the quiescent currents of the fourth to seventh quiescent current sources 251, 252, 253, 254 independently of the quiescent currents of the first to third quiescent current sources 212, 218, 223, for example to lower current intensities.

During operation of the ring oscillator 100 or of the delay stage 200, the quiescent currents of the fourth to seventh quiescent current sources 251, 252, 253, 254 are fed, controlled by the signal for frequency increase up/upb and the signal for frequency reduction dn/dnb, selectively to the fifth connection point 249 of the coupled source terminals of the first source-coupled transistor 210 and of the second source-coupled transistor 211 of the first differential pair 209 of the first signal transfer stage 208 with the first quiescent current source 212 to the first differential pair 209 of the first signal transfer stage 208 or to the sixth connection point 250 of the coupled source terminals of the first source-coupled transistor 221 and of the second source-coupled transistor 222 of the third differential pair 220 of the internal delay stage 219 with the third quiescent current source 223 to the third differential pair 220 of the internal delay stage 219, respectively.

This results in a—compared to the quiescent currents of the first and of the third quiescent current sources 212 and 223 preferably small—change in the quiescent currents of the first and of the third quiescent current sources 212, 223 of the first differential pair 209 of the source-coupled transistors 210, 211 or of the third differential pair 220 of the source-coupled transistors 221, 222 by at least one of the fourth to seventh quiescent current sources 251, 252, 253, 254.

This corresponds to a current modulation at the coupled source terminals of the transistors 210, 211 or 221, 222, respectively caused by the signals for frequency increase up/upb or for frequency reduction dn/dnb, i.e. the quiescent currents resulting in the coupled source terminals of the transistors 210, 211 or 221, 222 are, preferably slightly with respect to the quiescent currents of the first and of the third quiescent current sources 212 and 223, varied by the signals for frequency increase up/upb and frequency reduction dn/dnb, respectively.

The differential stages 237, 238 of the first current modulation stage 235 and the differential stages 239, 240 of the second current modulation stage 236 provide in this way for a slight quantized, i.e. so to speak digital current modulation achieved with this current modulation, and lead therefore essentially by the modulation of the transconductances of the source-coupled transistors 210, 211 in the first differential pair 209 and of the source-coupled transistors 221, 222 in the third differential pair 220 of the internal delay stage 219—and/or in the second differential pair 215 according to one of the aforementioned variations of the embodiment—, respectively, to a modulation of the delay of the signal in the first and second and third differential pairs 209 and 215 and 220, respectively, and thus to a corresponding modulation of the oscillation frequency of the oscillator 100.

This type of quantized frequency modulation is in particular applicable with advantage for CDRs with digital phase detectors. The control signals for the modules of the first current modulation stage 235 for the first current modulation and of the second current modulation stage 236 for the second current modulation are fed from the phase detector of the CDR.

With the mentioned control signals up/upb, dn/dnb from the phase detector, three cases [a], [b] and [c] are distinguished:

case [a]: Increasing the frequency compared to medium frequency by up=1 and dn=0;

case [b]: Reducing the frequency compared to frequency by up=0 and dn=1;

case [c]: Maintaining the medium frequency by up=0 and dn=0.

on case [a]:

The first differential stage 237, to which the frequency increase signal up/upb is fed, and the second differential stage 238, to which the frequency reduction signal dn/dnb is fed, of the first current modulation stage 235 do not feed current into the quiescent current setting of the first differential pair 209 of source-coupled transistors 210, 211.

Thus the whole quiescent current of the first quiescent current source 212 is available to the first differential pair 209, the transconductance of the source-coupled transistors 210, 211 of the first differential pair 209 is maximized, which results in maximized oscillation frequency of the oscillator ring, i.e. of the ring oscillator 100.

The same applies to the effect of the first and second differential stages 239 and 240, respectively, to which the frequency increase signal up/upb and the frequency reduction signal dn/dnb is also fed, of the second current modulation stage 236 on the quiescent current setting of the internal delay stage 219.

on case [b]:

The first and the second differential stages 237, 238, which in turn are driven by the frequency increase signal up/upb and the frequency reduction signal dn/dnb, of the first current modulation stage 235 feed an additional current, i.e. the quiescent currents of the fourth quiescent current source 251 and of the fifth quiescent current source 252, via the first source-coupled transistor 241 of the first differential stage 237 and the second source-coupled transistor 244 of the second differential stage 238 into the quiescent current setting of the first differential pair 209 of the source-coupled transistors 210, 211.

Thus the quiescent current of the first differential pair 209 is reduced by this current, i.e. by the current sum of the quiescent currents of the fourth quiescent current source 251 and of the fifth quiescent current source 252, the transconductance of the first differential pair 209 is reduced, which results in reduced oscillation frequency of the oscillator ring 100.

The same applies to the effect of the first and second differential stages 239 and 240, respectively, to which the frequency increase signal up/upb and the frequency reduction signal dn/dnb is also fed, of the second current modulation stage 236 on the quiescent current setting of the internal delay stage 219.

on case [c]:

The first differential stage 237 is again driven by the frequency increase signal up/upb. The first current modulation stage 235 feeds an additional current, i.e. the quiescent current of the fourth quiescent current source 251, via the first source-coupled transistor 241 of the first differential stage 237 into the quiescent current setting of the first differential pair 209 of the source-coupled transistors 210, 211, whereas the second differential stage 238, which is driven by the frequency reduction signal dn/dnb, does not.

Therefore, for the quiescent current setting of the first differential pair 209 of the source-coupled transistors 210, 211, a situation occurs halfway between the cases [a] and [b], leading to the setting of a medium oscillator frequency.

The same applies to the effect of the first and second differential stages 239 and 240, respectively, to which the frequency increase signal up/upb and the frequency reduction signal dn/dnb are also fed, of the second current modulation stage 236 on the quiescent current setting of the internal delay stage.

An essential advantage of the present invention is that no parasitic capacitances, in particular no parasitic capacitive loads, occur due to the insertion of frequency varying elements into the signal path of the oscillator.

A further advantage is that by variation of the quiescent current settings of the first current modulation stage 235 and of the second current modulation stage 236, the level of the frequency modulation can be adjusted in a relatively wide range.

Since, for example, when used in a CDR (=Clock and/or Data Recovery), the level of the frequency modulation determines the bandwidth of the CDR, the bandwidth of a CDR can additionally be varied without further intervention in the signal path of the oscillator 100, which reacts sensitively to additional parasitic elements.

In the state of the art mentioned above, this would only be possible by adding further varactors to the signal path. However, this is not possible without adding additional parasitic wiring capacitors, which reduces the maximum oscillation frequency of the oscillator.

In contrast thereto, the present invention avoids or at least reduces capacitive loads in the signal transfer paths. As delay stage in a ring oscillator, the device according to the present invention enables higher oscillation frequencies.

LIST OF REFERENCE NUMERALS 100 oscillator ring or ring oscillator
200 device, in particular delay stage
201 differential input of the device 200
202 input terminal of the differential input 201
203 input terminal of the differential input 201
204 differential output of the device 200
205 output terminal of the differential output 204
206 output terminal of the differential output 204
207 first signal transfer path of the device 200
208 first signal transfer stage of the first signal transfer path 207
209 first differential pair of the source-coupled transistors 210, 211 of the first signal transfer stage 208
210 first source-coupled transistor of the first differential pair 209
211 second source-coupled transistor of the first differential pair 209
212 common adjustable first quiescent current source of the first signal transfer stage 208 to the first differential pair 209
213 second signal transfer path of the device 200
214 second signal transfer stage of the second signal transfer path 213
215 second differential pair of the source-coupled transistors 216, 217 of the second signal transfer stage 214
216 first source-coupled transistor of the second differential pair 215
217 second source-coupled transistor of the second differential pair 215
218 common adjustable second quiescent current source of the second signal transfer stage 214 to the second differential pair 215
219 internal delay stage of the second signal transfer path 213
220 third differential pair of the source-coupled transistors 221, 222 of the internal delay stage 219
221 first source-coupled transistor of the third differential pair 220
222 second source-coupled transistor of the third differential pair 220
223 common adjustable third quiescent current source of the internal delay stage 219 to the third differential pair 220
224 signal combination stage of the device 200, provided with a resistive load common to the first differential pair 209 and the second differential pair 215
225 first work resistor, comprised by common resistive load in the signal combination stage 224
226 second work resistor, comprised by common resistive load in the signal combination stage 224
227 first connection point of the drain terminals of the first source-coupled transistors 210, 216, in particular current node for additive superposition of the currents in drain connections of the first source-coupled transistors 210, 216
228 second connection point of the drain terminals of the second source-coupled transistors 211, 217, in particular current node for additive superposition of the currents in drain connections of the second source-coupled transistors 211, 217
229 first supply voltage terminal, carrying first supply voltage potential VDD
230 third work resistor in internal delay stage 219
231 fourth work resistor in internal delay stage 219
232 third connection point of the drain terminal of the first source-coupled transistor 221 and of the gate terminal of the first source-coupled transistors 216
233 fourth connection point of the drain terminal of the second source-coupled transistor 222 and of the gate terminal of the second source-coupled transistors 217
234 second supply voltage terminal, carrying second supply voltage potential VSS
235 first current modulation stage for setting the quiescent current of the first quiescent current source 212

236 second current modulation stage for setting the quiescent current of the third quiescent current source 223
237 first differential stage of the source-coupled transistors 241, 242 of the first current modulation stage 235
238 second differential stage of the source-coupled transistors 243, 244 of the first current modulation stage 235
239 first differential stage of the source-coupled transistors 245, 246 of the second current modulation stage 236
240 second differential stage of the source-coupled transistors 247, 248 of the second current modulation stage 236
241 first source-coupled transistor of the first differential stage 237
242 second source-coupled transistor of the first differential stage 237
243 first source-coupled transistor of the second differential stage 238
244 second source-coupled transistor of the second differential stage 238
245 first source-coupled transistor of the first differential stage 239
246 second source-coupled transistor of the first differential stage 239
247 first source-coupled transistor of the second differential stage 240
248 second source-coupled transistor of the second differential stage 240
249 fifth connection point of the coupled source terminals of the first source-coupled transistor 210 and of the second source-coupled transistor 211 with first quiescent current source 212
250 sixth connection point of the coupled source terminals of the first source-coupled transistor 221 and of the second source-coupled transistor 222 with third quiescent current source 223
251 fourth quiescent current source of the first current modulation stage 235 to first differential stage 237
252 fifth quiescent current source of the first current modulation stage 235 to second differential stage 238
253 sixth quiescent current source of the second current modulation stage 236 to first differential stage 239
254 seventh quiescent current source of the second current modulation stage 236 to second differential stage 240
255 common control voltage terminal of the fourth quiescent current source 251 and of the fifth quiescent current source 252
256 common control voltage terminal of the sixth quiescent current source 253 and of the seventh quiescent current source 254
dn differential discretized signal for frequency reduction at the first source-coupled transistor 243, 247
dnb signal, complementary to the differential discretized signal dn, at the second source-coupled transistor 244, 248
up differential discretized signal for frequency increase at the first source-coupled transistor 241, 245
upb signal, complementary to the differential discretized signal up, at the second source-coupled transistor 242, 246
VDD first supply voltage potential, in particular positive compared to the second supply voltage potential VSS, at the first supply voltage terminal 229
VSS second supply voltage potential, in particular ground potential, at the second supply voltage terminal 234

While this invention has been described as having a preferred design, it is understood that it is capable of further modifications, and uses and/or adaptations of the invention and following in general the principle of the invention and including such departures from the present disclosure as come within the known or customary practice in the art to which the invention pertains, and as may be applied to the central features hereinbefore set forth, and fall within the scope of the invention.

The invention claimed is:

1. A device for controllably delaying an electrical signal, the device comprising:
   a first signal transfer path between a signal input and a signal output, the first signal transfer path comprising
   a first signal transfer stage with a first differential pair and a common, adjustable first quiescent current source,
   a second signal transfer path between the signal input and the signal output, the second signal transfer path comprising
   a second signal transfer stage with a second differential pair and a common, adjustable second quiescent current source, and
   an internal delay stage, arranged between the signal input and the second signal transfer stage and having a third differential pair and a common, adjustable third quiescent current source, and
   a signal combination stage for additively superimposing the electrical signal transferred via the first signal transfer path on to the electrical signal transferred via the second signal transfer path,
   further comprising a first current modulation stage, a second current modulation stage, and a third current modulation stage, at least one of the first or second or third current modulation stage configured for adjusting the quiescent current of at least one of the first or second or third quiescent current source,
   wherein the first or second or third current modulation stage is respectively provided with
   a first difference stage and an adjustable first current modulation quiescent current source common to the first difference stage, and
   a second difference stage and an adjustable second current modulation quiescent current source common to the second difference stage, wherein
   the first difference stage is providable with, as a first control signal, a discretized signal for frequency increase, and
   the second difference stage is providable with, as a second control signal, a discretized signal for frequency reduction, and
   the first and the second current modulation quiescent current source of each current modulation stage are commonly adjustable.

2. The device according to claim 1, wherein the first differential pair comprises at least two emitter- or source-coupled transistors.

3. The device according to claim 1, wherein the second differential pair comprises at least two emitter- or source-coupled transistors.

4. The device according to claim 1, wherein the third differential pair comprises at least two emitter- or source-coupled transistors.

5. The device according to claim 1, wherein the first current modulation stage is configured for adjusting the quiescent current of the first quiescent current source and the second current modulation stage is configured for adjusting the quiescent current of the third quiescent current source.

6. The device according to claim 1, wherein the first current modulation stage is configured for adjusting the quiescent current of the first quiescent current source and the third current modulation stage is configured for adjusting the quiescent current of the second quiescent current source.

7. The device according to claim 1, wherein the first or second or third current modulation stage is designed to supply and feed a respective additional current into the quiescent current setting of the first or second or third quiescent current source.

8. The device according to claim 1, wherein the first difference stage comprises a first current modulation difference pair.

9. The device according to claim 1, wherein the second difference stage comprises a second current modulation difference pair.

10. The device according to claim 1, wherein the first difference stage comprises at least two emitter- or source-coupled transistors.

11. The device according to claim 1, wherein the second difference stage comprises at least two emitter- or source-coupled transistors.

12. The device according to claim 1, wherein
the first current modulation quiescent current source comprises at least one fourth or sixth quiescent current source, or
the second current modulation quiescent current source comprises at least one fifth or seventh quiescent current source.

13. The device according to claim 1, wherein in the first or second or third current modulation stage, respectively, the first and the second current modulation quiescent current source are designed for supplying and feeding a respective additional current, controlled by the first and second control signal, into a quiescent current setting of the first or second or third quiescent current source, respectively.

14. The device according to claim 1, further comprising
a first supply voltage potential at a first supply voltage connection, and
a second supply voltage potential at a second supply voltage connection.

15. The device according to claim 14, wherein the second supply voltage potential is ground potential.

16. The device according to claim 14, wherein the first supply voltage potential is positive compared to the second supply voltage potential.

17. An oscillator ring, comprising at least one device according to claim 1.

18. A method for controlling the delay of an electrical signal and for said delaying the electrical signal by at least one device according to claim 1,
wherein the first or second or third current modulation stage is respectively provided with,
as a first control signal, a discretized signal for frequency increase, or
as a second control signal, a discretized signal for frequency reduction,
wherein, controlled by the first or second control signal, in the first or second or third current modulation stage a respective additional current is generated, and
wherein the respective additional current of the first or second or third current modulation stage is fed into a quiescent current setting of the first or second or third quiescent current source for adjusting the quiescent current of at least one of the first or second or third quiescent current source.

19. A method of recovering a clock and data with at least one device according to claim 1 and at least one digital phase detector wherein from the at least one digital phase detector a discretized signal for frequency increase is supplied as a first control signal or a discretized signal for frequency reduction is supplied as a second control signal.

20. A device for controllably delaying an electrical signal, the device comprising:
a first signal transfer path between a signal input and a signal output, the first signal transfer path comprising
a first signal transfer stage with a first differential pair and a common, adjustable first quiescent current source,
a second signal transfer path between the signal input and the signal output, the second signal transfer path comprising
a second signal transfer stage with a second differential pair and a common, adjustable second quiescent current source, and
an internal delay stage, arranged between the signal input and the second signal transfer stage and having a third differential pair and a common, adjustable third quiescent current source, and
a signal combination stage for additively superimposing the electrical signal transferred via the first signal transfer path on to the electrical signal transferred via the second signal transfer path,
further comprising a first current modulation stage, a second current modulation stage, and a third current modulation stage, at least one of the first or second or third current modulation stage configured for adjusting the quiescent current of at least one of the first or second or third quiescent current source,
wherein in the first or second or third current modulation stage, respectively, the first and the second current modulation quiescent current source are designed for supplying and feeding a respective additional current, controlled by a first and a second control signal, into a quiescent current setting of the first or second or third quiescent current source, respectively.

* * * * *